(12) United States Patent　　　(10) Patent No.: US 12,612,290 B2

Taylor et al.　　　(45) Date of Patent: Apr. 28, 2026

(54) WINCH WITH ADVANCED ELECTRICAL AND MECHANICAL SMART CONTROLS

(71) Applicant: Warn Industries, Inc., Clackamas, OR (US)

(72) Inventors: Calvin Taylor, Clackamas, OR (US); Troy Heynderickx, Clackamas, OR (US); Mitchell Lund, Clackamas, OR (US); Douglas Calvert, Clackamas, OR (US)

(73) Assignee: Warn Industries, Inc., Clackamas, OR (US)

( * ) Notice: Subject to any disclaimer, the term of this patent is extended or adjusted under 35 U.S.C. 154(b) by 188 days.

(21) Appl. No.: 18/483,815

(22) Filed: Oct. 10, 2023

(65) Prior Publication Data

US 2024/0125820 A1　　Apr. 18, 2024

Related U.S. Application Data

(60) Provisional application No. 63/415,432, filed on Oct. 12, 2022.

(51) Int. Cl.
*G01R 15/20*　　　(2006.01)
*B66D 1/12*　　　(2006.01)
(Continued)

(52) U.S. Cl.
CPC ............. *G01R 15/202* (2013.01); *B66D 1/12* (2013.01); *B66D 1/16* (2013.01); *B66D 1/225* (2013.01); *B66D 1/485* (2013.01)

(58) Field of Classification Search
CPC .......... G01R 15/202; B66D 1/12; B66D 1/16; B66D 1/225; B66D 1/485; B66D 1/40; B66D 1/22
See application file for complete search history.

(56) References Cited

U.S. PATENT DOCUMENTS 9,975,742 B1 * 5/2018 Mason ..................... B66D 1/46
2009/0284877 A1 * 11/2009 Heravi ..................... H02H 7/09
361/31

(Continued)

FOREIGN PATENT DOCUMENTS

AU　　2014101556 A4　10/2015
CA　　　2986294 A1　6/2018
(Continued)

OTHER PUBLICATIONS

International Search Report & Written Opinion from corresponding International Patent Application No. PCT/US2023/076451, mailed Mar. 4, 2024. 15 pages.

*Primary Examiner* — Dominic E Hawkins
(74) *Attorney, Agent, or Firm* — K&L Gates LLP

(57) ABSTRACT

A winch includes a motor, a gear reduction unit, a tie structure, an external power cable, and a rotatable drum. The motor includes a motor housing with a motor case and a first drum support attached to the motor case. The gear reduction unit is drivingly attached to the motor and has a gear housing including a gear case and a second drum support. The tie structure connects said first and second drum supports. The external power cable having a first end and a second end. The first end of the external power cable is configured to be coupled to an external power source. The second end of the external power cable is coupled to a bus bar. The rotatable drum is drivingly connected to the motor and supported by the first and second drum supports.

17 Claims, 7 Drawing Sheets

(51) Int. Cl.
    B66D 1/16          (2006.01)
    B66D 1/22          (2006.01)
    B66D 1/48          (2006.01)

(56)            References Cited

U.S. PATENT DOCUMENTS

| | | |
|---|---|---|
| 2014/0001427 A1 | 1/2014 | Fretz et al. |
| 2018/0175713 A1* | 6/2018 | Fretz ..................... H02K 11/25 |
| 2018/0201488 A1 | 7/2018 | Zheng |
| 2019/0178917 A1* | 6/2019 | Shimizu ............ G01R 19/0092 |
| 2019/0212372 A1* | 7/2019 | Bilbao De Mendizabal ............... |
| | | G01R 33/09 |
| 2020/0131010 A1 | 4/2020 | Kukula et al. |
| 2021/0139299 A1* | 5/2021 | Crain ..................... B66D 1/505 |
| 2023/0101055 A1* | 3/2023 | Caldwell ............... B66D 1/485 |
| | | 254/276 |

FOREIGN PATENT DOCUMENTS

| | | |
|---|---|---|
| CN | 206172856 U | 5/2017 |
| CN | 107827008 A | 3/2018 |

* cited by examiner

WINCH WITH ADVANCED ELECTRICAL AND MECHANICAL SMART CONTROLS

PRIORITY CLAIM AND CROSS-REFERENCE TO RELATED APPLICATIONS

This application claims priority to and the benefit of U.S. Provisional Patent Application No. 63/415,432 titled WINCH WITH ADVANCED ELECTRICAL AND MECHANICAL SMART CONTROLS, filed Oct. 12, 2022, the entire contents of which are incorporated by reference herein in their entirety and relied upon.

FIELD

The present disclosure relates generally to systems for guiding and controlling retractable ropes, lines, and cables having advanced sensing and control capabilities.

BACKGROUND

Winches typically include a motor for driving a rotatable drum of the winch to pull in or pull out a cable wound around the drum. In certain instances, the winch may be controlled via a control unit located at a location away from the motor. Further, a remote control may wirelessly (or via a wired connection) control winch operation through electronic communication with this control unit.

The winch motor is electrically coupled with a power source in order to drive the motor. It is often difficult to accurately measure and control electrical power as it is delivered from the power source to the motor. Existing technology does not provide for instantaneous measurement of power metrics, nor related communication of measured values to the control unit (for subsequent and dynamic control by the control unit). Power measurement, and related control of power, has additional implications beyond the electrical realm; namely, power control and power overload must be managed mechanically, as power overload can cause mechanical overloading and may lead to subsequent mechanical failure.

Improved winches and related systems having smart controls for electrical detection, power management, and related mechanical safeguards for avoiding mechanical overloading are therefore needed.

SUMMARY

The winches and winch systems disclosed herein improve on existing winch technology by providing integrated smart control packs that can be advantageously used with a winch and additional components to dynamically detect electrical parameters, such as current and voltage, and additionally communicate with and control various mechanical components, such as a remote clutch, to safely manage mechanical loads and avoid overloading.

In light of the disclosure, and without limiting the scope of the invention in any way, in a first aspect of the present disclosure, which may be combined with any other aspect listed herein unless specified otherwise, a winch includes a motor, a gear reduction unit, a tie structure, an external power cable, and a rotatable drum. The motor includes a motor housing including a motor case and a first drum support attached to the motor case for closing an end of the motor case. The gear reduction unit is drivingly attached to the motor and includes a gear housing including a gear case and a second drum support attached to the gear case for closing an end of the gear case. The tie structure connects the first drum support and the second drum support. The external power cable includes a first end and a second end. The first end of the external power cable is configured to be coupled to an external power source, and the second end of the external power cable is coupled to a bus bar. The rotatable drum is drivingly connected to the motor and supported by the first drum support and the second drum support.

In a second aspect of the present disclosure, which may be combined with any other aspect listed herein unless specified otherwise, the bus bar is disposed within a control pack housing.

In a third aspect of the present disclosure, which may be combined with any other aspect listed herein unless specified otherwise, the bus bar includes a constant thickness from a first end of the bus bar to the second end of the bus bar.

In a fourth aspect of the present disclosure, which may be combined with any other aspect listed herein unless specified otherwise, the bus bar includes a notch disposed between the first end of the bus bar and the second end of the bus bar.

In a fifth aspect of the present disclosure, which may be combined with any other aspect listed herein unless specified otherwise, a current sensor is disposed adjacent to the bus bar at the notch.

In a sixth aspect of the present disclosure, which may be combined with any other aspect listed herein unless specified otherwise, the current sensor includes two protrusions, each of which extends into the notch.

In a seventh aspect of the present disclosure, which may be combined with any other aspect listed herein unless specified otherwise, the current sensor is a Hall effect sensor.

In an eighth aspect of the present disclosure, which may be combined with any other aspect listed herein unless specified otherwise, the current sensor includes a cable, coupled to a circuit board.

In a ninth aspect of the present disclosure, which may be combined with any other aspect listed herein unless specified otherwise, the current sensor is configured to measure current delivered to the winch from the external power source via the external power cable.

In a tenth aspect of the present disclosure, which may be combined with any other aspect listed herein unless specified otherwise, the bus bar includes a plurality of angular bends between the first end of the bus bar and the second end of the bus bar.

In an eleventh aspect of the present disclosure, which may be combined with any other aspect listed herein unless specified otherwise, the plurality of angular bends include two 90-degree bends.

In a twelfth aspect of the present disclosure, which may be combined with any other aspect listed herein unless specified otherwise, the tie structure is an only component coupled to both the first drum support and the second drum support.

In a thirteenth aspect of the present disclosure, which may be combined with any other aspect listed herein unless specified otherwise, a winch includes a motor and a first drum support, a gear reduction unit drivingly attached to the motor and a second drum support, a tie structure, an external power cable, and rotatable drum. The tie structure connects the first drum support and the second drum support. The external power cable includes a first end and a second end. The first end of the external power cable is configured to be coupled to an external power source. The second end of the external power cable is coupled to a bus bar. The bus bar is an exclusive pathway for electrical power between the external power source and the winch, such that all electrical power from external power source to the winch flows across the bus bar. The rotatable drum is drivingly connected to the motor.

In a fourteenth aspect of the present disclosure, which may be combined with any other aspect listed herein unless specified otherwise, the bus bar is disposed within a control pack housing.

In a fifteenth aspect of the present disclosure, which may be combined with any other aspect listed herein unless specified otherwise, the bus bar includes a constant thickness from a first end of the bus bar to the second end of the bus bar.

In a sixteenth aspect of the present disclosure, which may be combined with any other aspect listed herein unless specified otherwise, the bus bar includes a notch disposed between the first end of the bus bar and the second end of the bus bar.

In a seventeenth aspect of the present disclosure, which may be combined with any other aspect listed herein unless specified otherwise, a current sensor is disposed adjacent to the bus bar at the notch.

In an eighteenth aspect of the present disclosure, which may be combined with any other aspect listed herein unless specified otherwise, the current sensor is a Hall effect sensor.

In a nineteenth aspect of the present disclosure, which may be combined with any other aspect listed herein unless specified otherwise, the current sensor is configured to measure current delivered to the winch from the external power source via external the power cable.

In a twentieth aspect of the present disclosure, which may be combined with any other aspect listed herein unless specified otherwise, a method of measuring current includes delivering electrical power from an external power source to a winch via an external power cable, such that current flows from an end of the external power cable, across a bus bar, and into the winch. The method includes detecting, via a Hall effect sensor, current flowing across the bus bar. The Hall effect sensor is disposed adjacent to the bus bar at a notch of the bus bar. The method includes communicating detected current to a controller.

In a twenty-first aspect of the present disclosure, which may be combined with any other aspect listed herein unless specified otherwise, a remote clutch includes a gear housing including ring gear. The ring gear is removably coupled to a drivetrain of a winch. The gear housing includes an electromagnetic solenoid assembly, a pivot arm, and a clutch pin. The electromagnetic solenoid assembly includes a plunger disposed therein. The pivot arm is hingedly coupled to the electromagnetic solenoid assembly. The clutch pin is disposed perpendicular to the plunger and coupled to the pivot arm. Engagement of the electromagnetic solenoid causes the clutch pin to disengage. The clutch pin is configured to be manually disengaged by rotating a clutch handle.

In a twenty-second aspect of the present disclosure, which may be combined with any other aspect listed herein unless specified otherwise, vertical translation of the plunger causes horizontal translation of the clutch pin.

In a twenty-third aspect of the present disclosure, which may be combined with any other aspect listed herein unless specified otherwise, the remote clutch further includes a plurality of torsion springs for mechanical biasing of the clutch pin.

In a twenty-fourth aspect of the present disclosure, which may be combined with any other aspect listed herein unless specified otherwise, the electromagnetic solenoid assembly includes two power modes, a pull-mode and a hold-mode. Each of the two power modes requires a different power input.

In a twenty-fifth aspect of the present disclosure, which may be combined with any other aspect listed herein unless specified otherwise, the two power modes are regulated via plus-width modulation.

In a twenty-sixth aspect of the present disclosure, which may be combined with any other aspect listed herein unless specified otherwise, the two power modes are controlled via a control pack on the winch.

In a twenty-seventh aspect of the present disclosure, which may be combined with any other aspect listed herein unless specified otherwise, the clutch handle includes a keyed feature configured to mechanically engage with a portion of the clutch pin.

In a twenty-eighth aspect of the present disclosure, which may be combined with any other aspect listed herein unless specified otherwise, the remote clutch further includes a feedback switch, the feedback switch configured to be triggered when the clutch pin is disengaged.

In a twenty-ninth aspect of the present disclosure, which may be combined with any other aspect listed herein unless specified otherwise, responsive to clutch pin disengagement, the feedback switch sends a visual notification of a free-spool state.

In a thirtieth aspect of the present disclosure, which may be combined with any other aspect listed herein unless specified otherwise, the gear housing is configured to be coupled to the winch as a replacement to an existing gear housing disposed on the winch.

In a thirty-first aspect of the present disclosure, which may be combined with any other aspect listed herein unless specified otherwise, a remote clutch includes an electromagnetic solenoid assembly, a pivot arm, and a clutch pin. The electromagnetic solenoid assembly includes a plunger disposed therein. The pivot arm is hingedly coupled to the electromagnetic solenoid assembly. The clutch pin is disposed perpendicular to the plunger and coupled to the pivot arm. Engagement of the electromagnetic solenoid causes the plunger to translate vertically, causes the pivot arm to pivot, and causes the clutch pin to translate horizontally and disengage.

In a thirty-second aspect of the present disclosure, which may be combined with any other aspect listed herein unless specified otherwise, the clutch pin is configured to be manually disengaged by rotating a clutch handle.

In a thirty-third aspect of the present disclosure, which may be combined with any other aspect listed herein unless specified otherwise, the clutch handle includes a keyed feature configured to mechanically engage with a portion of the clutch pin.

In a thirty-fourth aspect of the present disclosure, which may be combined with any other aspect listed herein unless specified otherwise, the remote clutch further includes a plurality of torsion springs for mechanical biasing of the clutch pin.

In a thirty-fifth aspect of the present disclosure, which may be combined with any other aspect listed herein unless specified otherwise, the electromagnetic solenoid assembly includes two power modes, a pull-mode and a hold-mode. Each of the two power modes requires a different power input.

In a thirty-sixth aspect of the present disclosure, which may be combined with any other aspect listed herein unless specified otherwise, the two power modes are regulated via plus-width modulation.

In a thirty-seventh aspect of the present disclosure, which may be combined with any other aspect listed herein unless specified otherwise, the two power modes are controlled via a control pack on the winch.

In a thirty-eighth aspect of the present disclosure, which may be combined with any other aspect listed herein unless specified otherwise, the remote clutch further includes a feedback switch, the feedback switch configured to be triggered when the clutch pin is disengaged.

In a thirty-ninth aspect of the present disclosure, which may be combined with any other aspect listed herein unless specified otherwise, responsive to clutch pin disengagement, the feedback switch sends a visual notification of a free-spool state.

In a fortieth aspect of the present disclosure, which may be combined with any other aspect listed herein unless specified otherwise, a method of disengaging a clutch pin of a winch includes engaging an electromagnetic solenoid, causing a plunger to translate vertically within an interior of the electromagnetic solenoid. The method includes pivoting a pivot arm, and translating a clutch pin horizontally, such that the clutch pin disengages from a drivetrain of the winch.

In a forty-first aspect of the present disclosure, which may be combined with any other aspect listed herein unless specified otherwise, a current sensing system for a winch includes a current sensor disposed on a winch. The winch is configured to receive power from an external source via a power cable, such that the current sensor measures current passing through the power cable.

In a forty-second aspect of the present disclosure, which may be combined with any other aspect listed herein unless specified otherwise, the current sensor is a Hall-effect sensor.

In a forty-third aspect of the present disclosure, which may be combined with any other aspect listed herein unless specified otherwise, the current sensor is a coreless Hall-effect current sensor.

In a forty-fourth aspect of the present disclosure, which may be combined with any other aspect listed herein unless specified otherwise, the current sensor is mounted on a bus bar.

In a forty-fifth aspect of the present disclosure, which may be combined with any other aspect listed herein unless specified otherwise, the bus bar is coupled to the power cable.

In a forty-sixth aspect of the present disclosure, which may be combined with any other aspect listed herein unless specified otherwise, the bus bar includes a notch, configured to direct current past the current sensor.

In a forty-seventh aspect of the present disclosure, which may be combined with any other aspect listed herein unless specified otherwise, the current sensor is mounted adjacent to the power cable.

In a forty-eighth aspect of the present disclosure, which may be combined with any other aspect listed herein unless specified otherwise, the current sensor is electrically coupled to a data collection device.

In a forty-ninth aspect of the present disclosure, which may be combined with any other aspect listed herein unless specified otherwise, the data collection device is a micro-controller.

In a fiftieth aspect of the present disclosure, which may be combined with any other aspect listed herein unless specified otherwise, the microcontroller includes an analog-to-digital converter.

In a fifty-first aspect of the present disclosure, which may be combined with any other aspect listed herein unless specified otherwise, the microcontroller transmits digital information associated with detected current, and the digital information is transmitted over a digital transmission bus protocol.

In a fifty-second aspect of the present disclosure, which may be combined with any other aspect listed herein unless specified otherwise, the system further includes a temperature sensor.

In a fifty-third aspect of the present disclosure, which may be combined with any other aspect listed herein unless specified otherwise, the current sensor is powered via a control pack.

In a fifty-fourth aspect of the present disclosure, which may be combined with any other aspect listed herein unless specified otherwise, the control pack is disposed on the winch.

In a fifty-fifth aspect of the present disclosure, which may be combined with any other aspect listed herein unless specified otherwise, the control pack is disposed at a location remote from the winch.

In a fifty-sixth aspect of the present disclosure, which may be combined with any other aspect listed herein unless specified otherwise, the current sensor is powered directly via the power cable.

In a fifty-seventh aspect of the present disclosure, which may be combined with any other aspect listed herein unless specified otherwise, a current sensing system for a winch includes a current sensor disposed on a notched bus bar of a winch, such that the current sensor measures current passing through an external power cable of the winch.

In a fifty-eighth aspect of the present disclosure, which may be combined with any other aspect listed herein unless specified otherwise, the current sensor is a Hall-effect sensor.

In a fifty-ninth aspect of the present disclosure, which may be combined with any other aspect listed herein unless specified otherwise, the current sensor is a coreless Hall-effect current sensor.

In a sixtieth aspect of the present disclosure, which may be combined with any other aspect listed herein unless specified otherwise, the current sensor is powered via a control pack disposed on the winch.

Additional features and advantages of the disclosed devices, systems, and methods are described in, and will be apparent from, the following Detailed Description and the Figures. The features and advantages described herein are not all-inclusive and, in particular, many additional features and advantages will be apparent to one of ordinary skill in the art in view of the figures and description. Also, any particular embodiment does not have to have all of the advantages listed herein. Moreover, it should be noted that the language used in the specification has been selected for readability and instructional purposes, and not to limit the scope of the inventive subject matter.

BRIEF DESCRIPTION OF THE FIGURES

Understanding that figures depict only typical embodiments of the invention and are not to be considered to be limiting the scope of the present disclosure, the present disclosure is described and explained with additional specificity and detail through the use of the accompanying figures. The figures are listed below.

DETAILED DESCRIPTION

Figure 1:
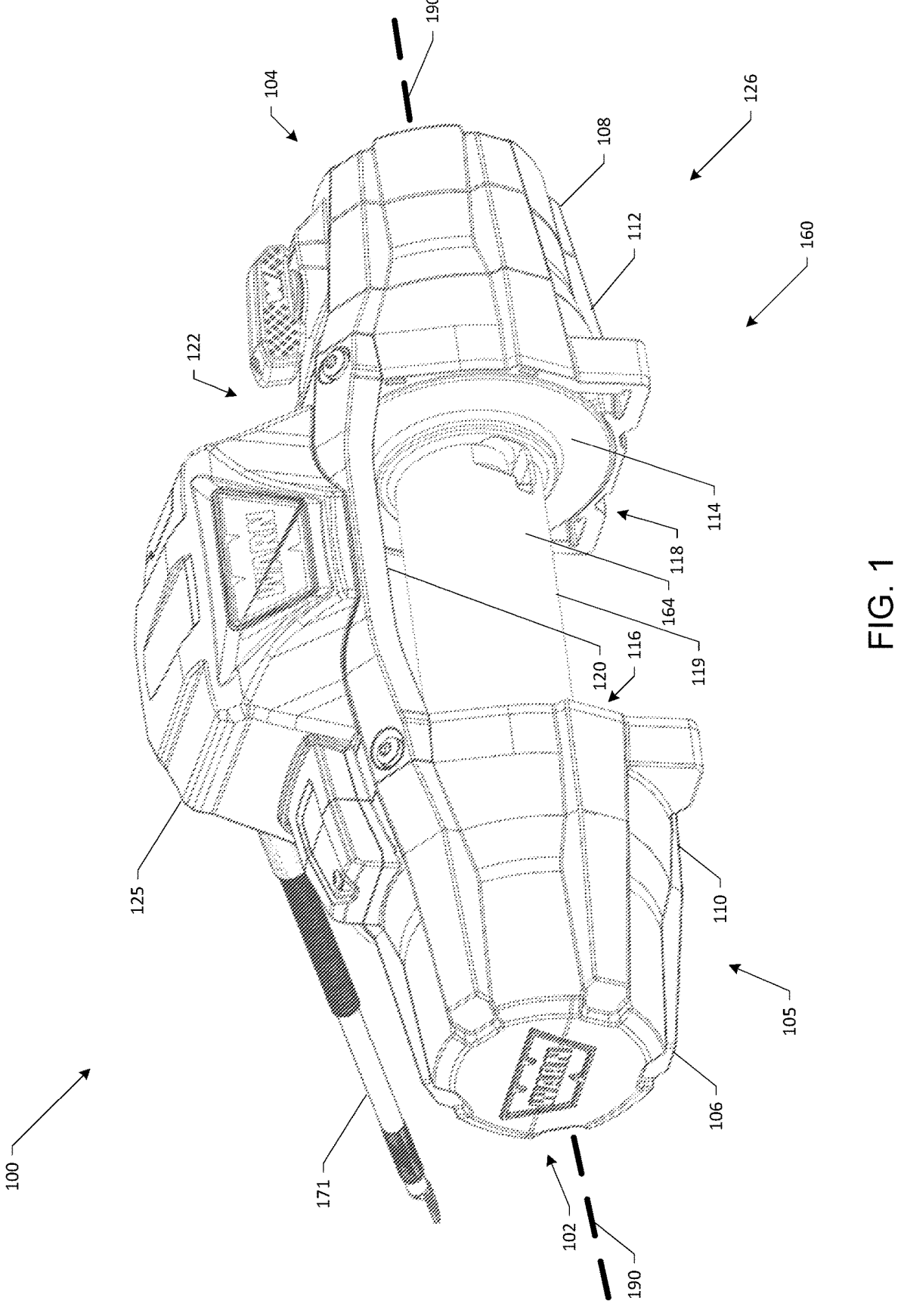
FIG. 1 illustrates a perspective view of a winch with a motor housing and a gear housing.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specific the presence of stated features, integers, steps, operations, elements, and/or components, but do not preclude the presence or additional of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent"). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

With reference to FIG. 1, FIG. 1 illustrates a perspective view of a winch 100 including a housing 160. Housing 160 includes a first drum support 110 and a second drum support 112. The housing 160 includes a motor housing 105 formed by the first drum support 110 coupled to a motor end cap 106. The housing 160 also includes a gear housing 126 formed by the second drum support 112 coupled to a gear end cap 108. In some examples, the motor end cap 106 may be mounted (e.g., fastened) directly to the first drum support 110. In other examples, the motor end cap 106 may be indirectly mounted to the first drum support 110 via a coupling to one or more components (e.g., additional housing elements) between the motor end cap and the first drum support 110. Similar coupling should be appreciated between gear end cap 108 and second drum support 112.

A motor is disposed within the motor housing 105. A gear reduction unit including a plurality of gears (e.g., such as a planetary gear set) and a clutch is disposed within the gear housing 126. A tie structure 120 is positioned at a top side 122 of the winch 100.

A controller 125 is typically positioned within the housing 160, such as on the top side 122 of winch 100. Controller 125 may be an electronic controller (such as a microcontroller) and may control a speed of the motor within the motor housing 105 and/or a gear selection of a gear set (e.g., gear reduction unit) positioned within the gear housing 126. In some examples, the controller may control operation of one or more accessories of the winch (e.g., winch lights, lights of a vehicle coupled to the winch, etc.). In one example, an operator of the winch may provide input (e.g., instructions) to the controller via wireless communication (e.g., via a remote control). For example, the operator may interface with a remote control in order to select a mode of operation of the winch 100. In certain embodiments, controller 125 is referred to as a "control pack" herein; that said, it should be appreciated that in other embodiments controller

125 may be readily disposed in alternate locations (besides atop the winch 100), such as at a location that is physically remote from the winch 100.

The motor and gear set are each coupled to a drum 118 of the winch 100 in order to rotate the drum 118 around a central axis 190. The motor housing 105 is positioned at a first end 102 of the winch 100 and the gear housing 126 is positioned at a second end 104 of the winch 100, with the first end 102 being opposite to the second end 104 in a direction of the central axis 190. The drum 118 is coupled to the motor through the gear reduction unit which is coupled to the motor through an interior of a cylindrical portion 164 of the drum 118. The controller may also control a position of the clutch disposed within the gear housing 126. The clutch may engage and disengage the gear reduction unit (e.g., transmission of the winch) with a drum 118 of the winch 100, thereby allowing the drum 118 to be driven by the motor or free spool (e.g., freely rotate without input from the motor and gear reduction unit).

In one example operation of the winch 100, the motor may drive the drum 118 to rotate around the central axis 190 in a first direction or a second direction opposite to the first direction. For example, the motor may be driven in the first direction in order to rotate the drum 118 around the central axis 190; similarly, the motor may be driven in the second direction opposite to the first direction in order to rotate the drum 118 around the central axis in the second direction. In this example, a selected gear of the gear set may adjust a rotational speed of the drum relative to a rotational speed of the motor. In one example, a rope (e.g., cable) may be wound around an outer surface 119 of the drum 118 in order to perform pulling operations via the winch 100. In some examples, the rope may be coupled with a hook in order to increase an ease of attachment of the rope to an object (e.g., a vehicle) to perform pulling operations.

The drum 118 includes a first flange 116 positioned at a first end of the cylindrical portion 164 of the drum 118 and a second flange 114 positioned at a second end of the cylindrical portion 164 of the drum 118. The first flange 116 and second flange 114 each are cylindrical in shape and have a diameter that is greater than a diameter of the cylindrical portion 164 of the drum 118 (e.g., the portion extending between the first flange 116 and second flange 114). The first flange 116 is supported by first drum support 110 while the second flange 114 is supported by second drum support 112. The first flange 116 and second flange 114 are coupled with their respective supports (e.g., first drum support 110 and second drum support 112, respectively) such that each flange is rotatable within the corresponding drum support when the motor is actuated to drive the drum 118 (or when the drum is in a free spool mode). In other words, as the motor within motor housing 105 is energized by an external power source (e.g., a vehicle battery), the motor may drive the drum 118 to rotate around the central axis 190. In one example, the motor may be energized in response to a selection of an operation mode by an operator of the winch (e.g., via a remote control) as described above. As the drum 118 is driven, the first flange 116 rotates within the first drum support 110 and the second flange 114 rotates within the second drum support 112.

In some examples, electrical current may flow from the power source to the winch 100 via a power cable 171 coupled to a plug. Generally, electrical current may flow from the power source and through the contactor assembly to the motor in order to energize the motor.

In an embodiment, by positioning the contactor assembly within the motor housing 105 and coupling the contactor assembly to the motor according to the configurations described below, an amount of wired electrical connections coupling the motor to the power source may be reduced. For example, the power cable 171 is the only wired electrical connection coupling the contactor assembly to the power source, and because the contactor assembly is directly coupled with the motor, electrical current may flow directly from the power source to the motor via the contactor assembly without an additional power cable (similar to power cable 171) coupled between the contactor assembly and the motor. That said, in various embodiments herein power-coupling includes direct contact with a bus bar.

Figure 5A:
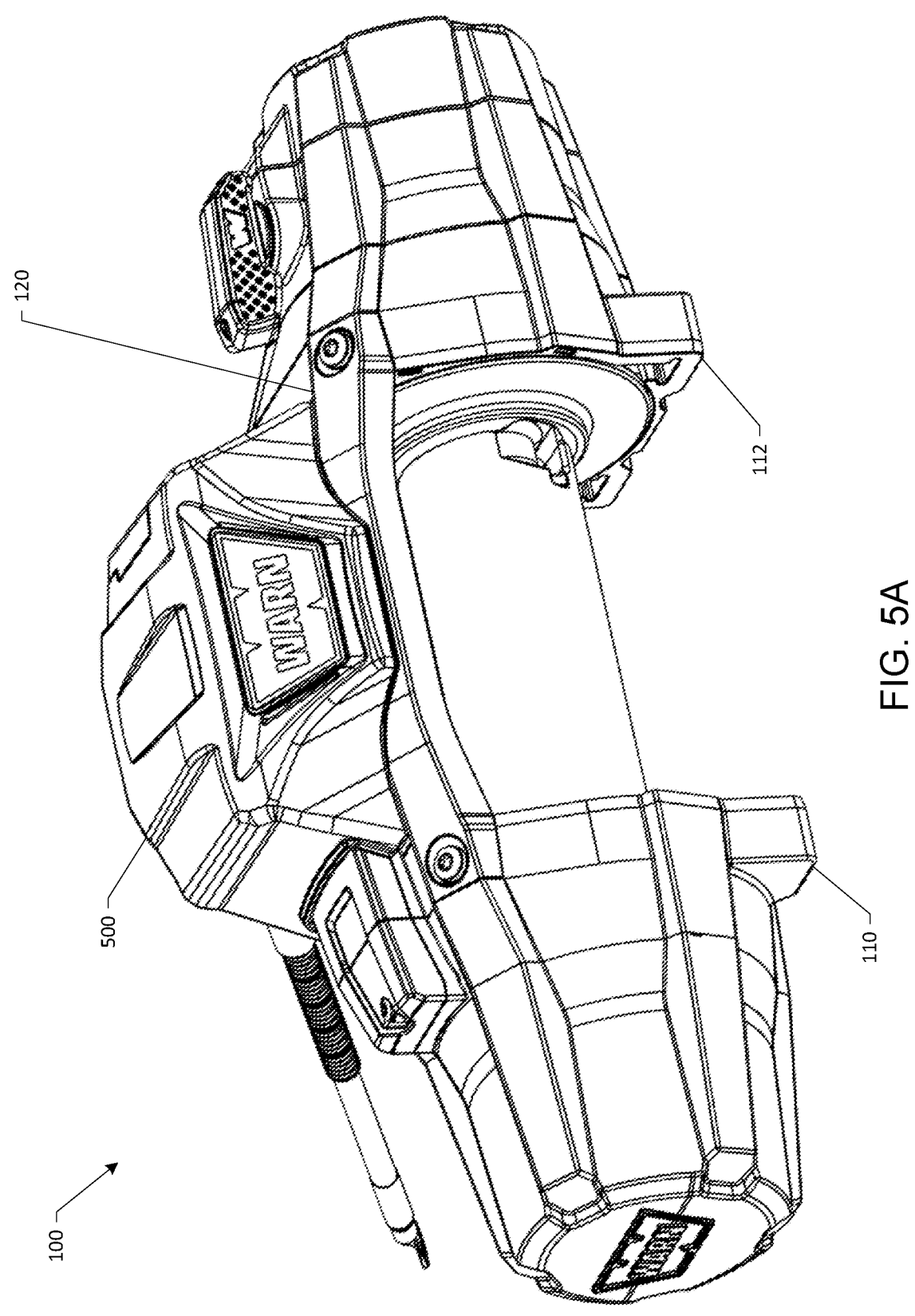
FIG. 5A illustrates a smart control pack on top of a winch, according to an example embodiment of the present disclosure.
Figure 5B:
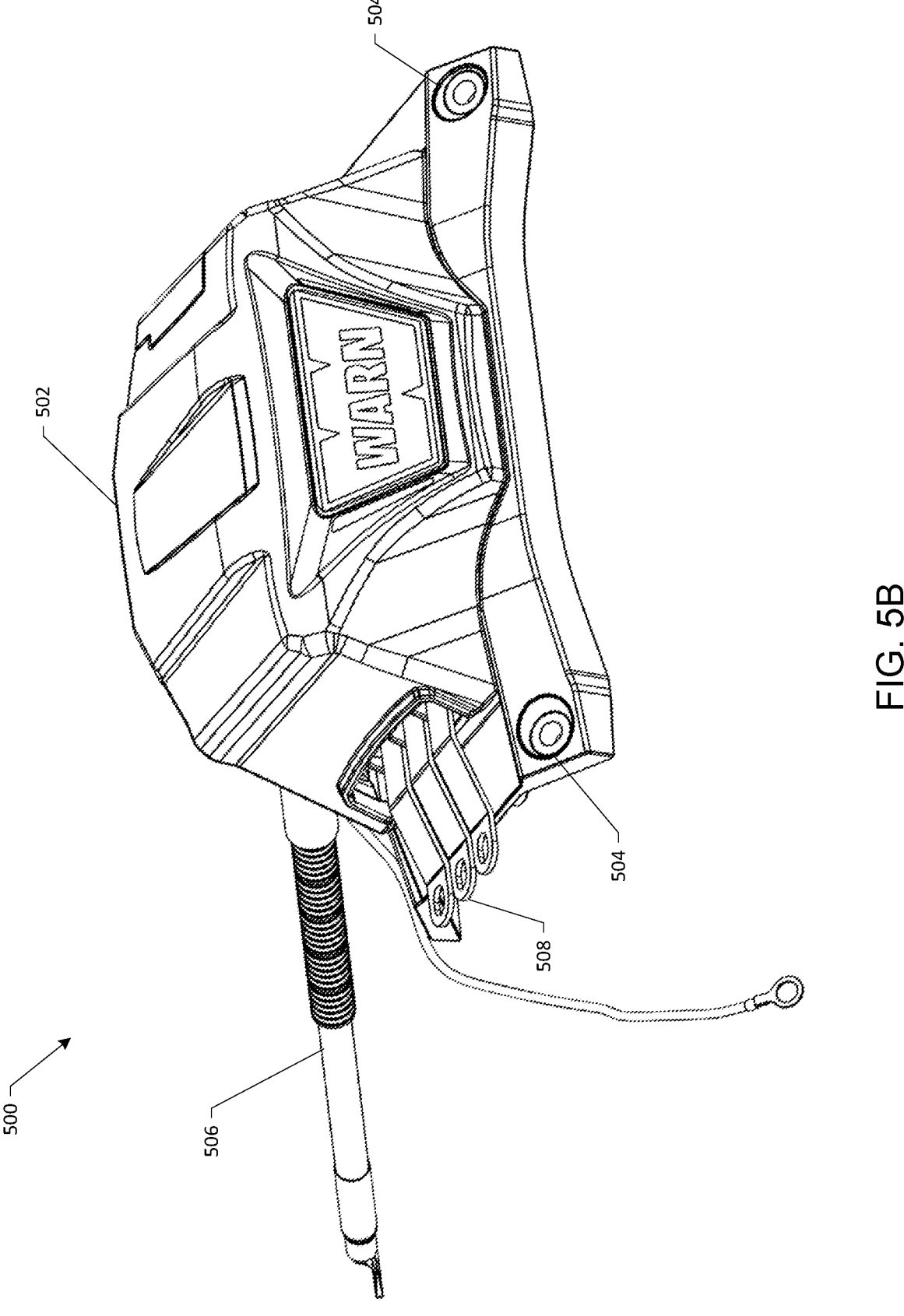
FIG. 5B illustrates a smart control pack and related electrical connections, according to an example embodiment of the present disclosure.
Figure 5C:
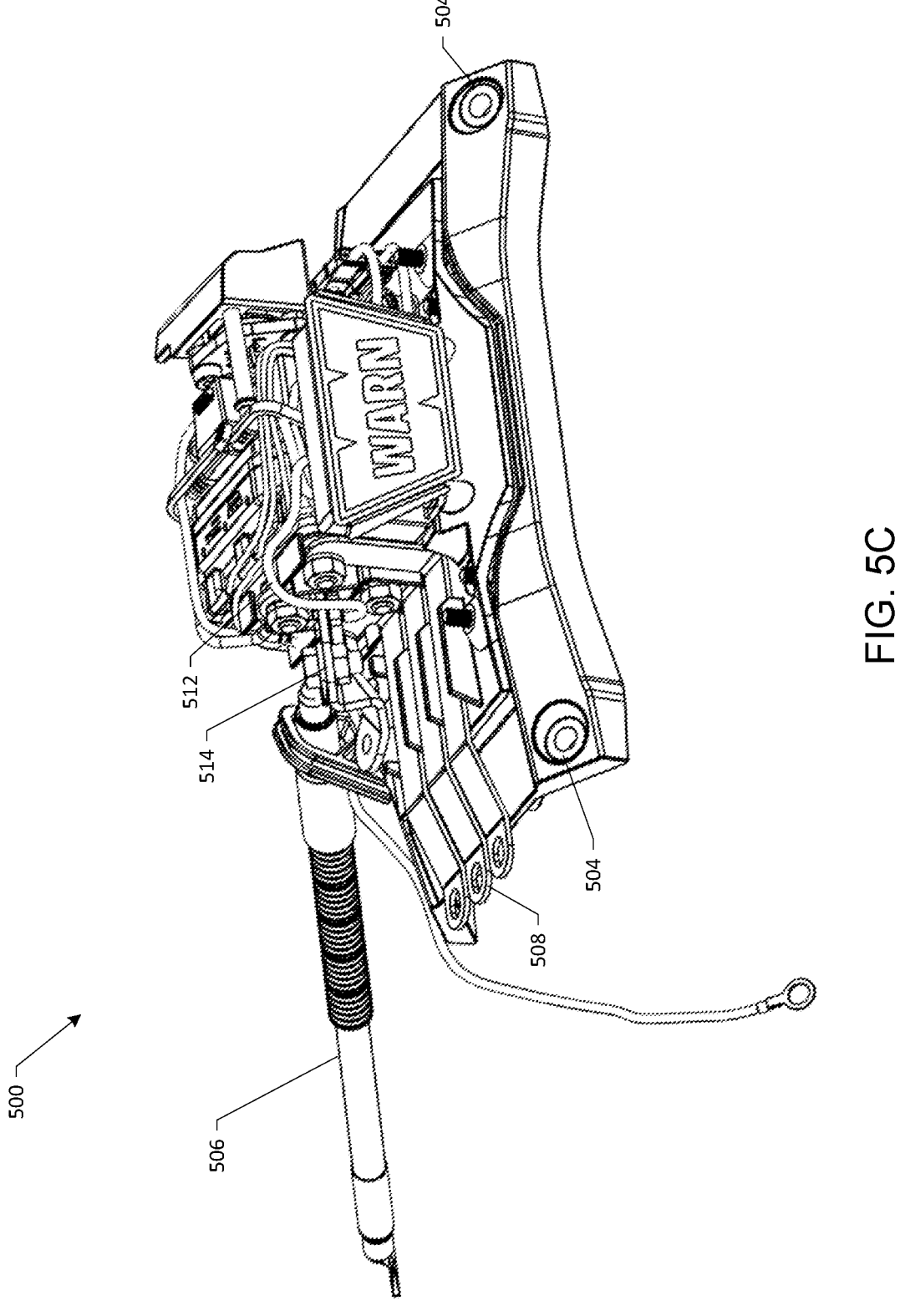
FIG. 5C illustrates a smart control pack with a removed housing, according to an example embodiment of the present disclosure.

Power flow and related components are further illustrated by FIGS. 2A to 2B and 5A to 5C. Specifically, as illustrated in FIG. 1, electrical power flows from power source, through external power supply cable 171 and across a bus bar 200 (as described below) in order power the winch and other related components. As illustrated by FIG. 5C, electrical power flows from the power source through external power supply cable 506, across bus bar 514, and into control pack 500; from here, power can flow into one or more electrical terminals via terminal receptacles 508. Regardless of terminal configuration, it should be appreciated that both of these embodiments, and additional embodiments herein, implement a bus bar as an exclusive pathway for electrical power between the external power source and the winch, such that all electrical power from external power source to the winch flows across the bus bar.

Returning to FIGS. 2A to 2B, in a preferred embodiment, bus bar 200 is constructed of copper. It should be appreciated, however, that other conductive materials are similarly contemplated herein. Bus bar 200 generally includes a plurality of apertures 202, 204, 206, which are configured for mechanical and electrical engagement with terminals, such as an electrical terminal and a motor terminal (not illustrated). Namely, as an example, an electrical terminal is disposed within and mechanically affixed to aperture 202; similarly, a motor terminal is disposed within an mechanically affixed to aperture 206. Thus, via this mechanical engagement, electrical power flows from the electrical terminal to bus bar 200, across the bus bar, and into the motor terminal (not illustrated).

Figures 2A, 2B:
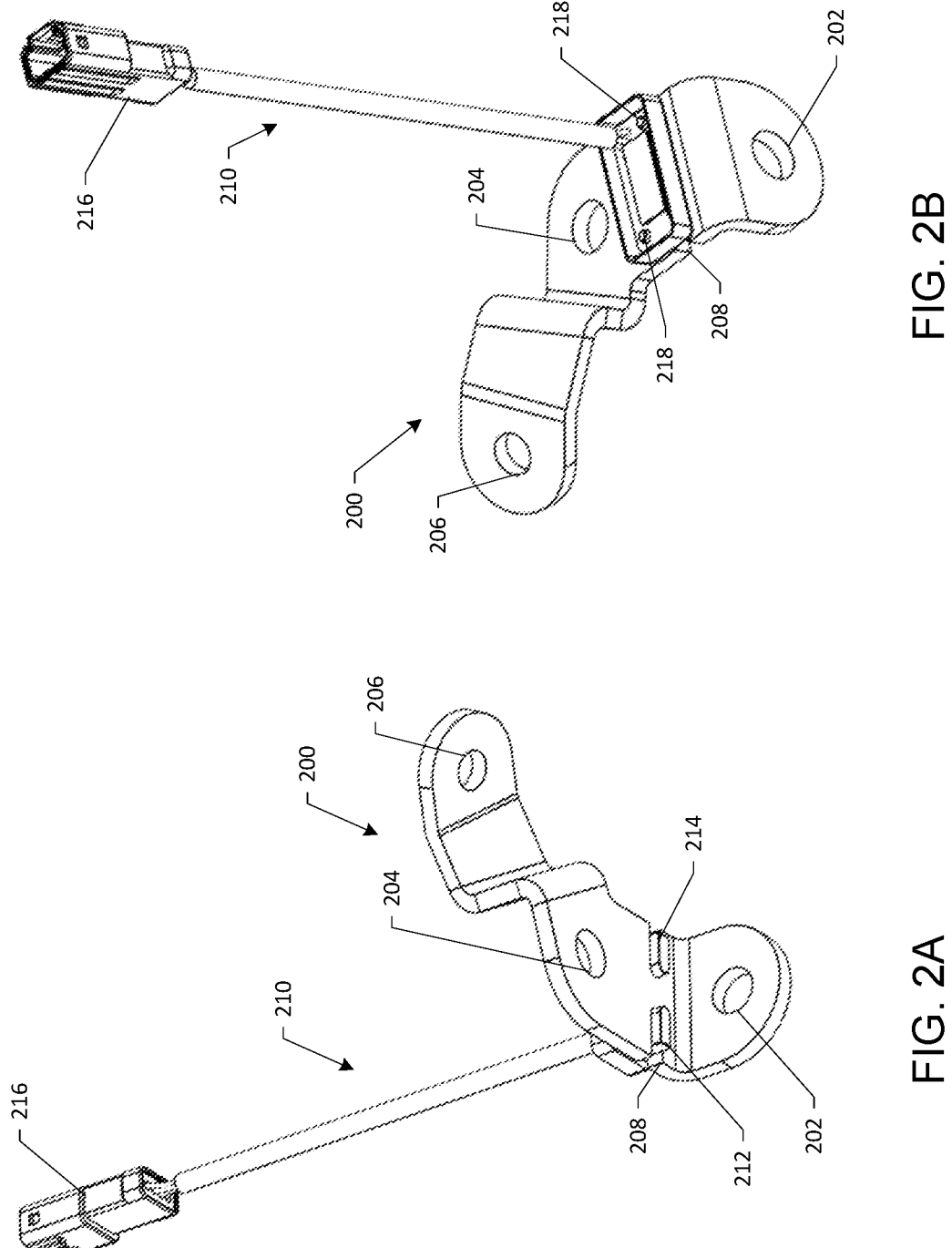
FIGS. 2A to 2B illustrate perspective views of a bus bar and related current sensing system, according to an example embodiment of the present disclosure.

In an embodiment, as illustrated by FIGS. 2A to 2B, bus bar 200 includes one or more bends (e.g., oblique and/or right angles) to accommodate its positioning within housing 160 of winch 100. Regardless of bends, it should be appreciated that the width of bus bar 200 is fixed across the length of bus bar 200, but for a notch 208 (described in greater detail herein). Furthermore, it should be appreciated that the thickness of bus bar 200 is fixed across the length of bus bar 200.

Bus bar 200 additional includes notch 208, which constitutes a reduced width across a portion of the length of bus bar 200. Notch 208 is configured to receive a proximal end of current sensor 210, so that current sensor 210 is disposed adjacent to notch 208. For example, current sensor 210 includes a first protrusion 212 and a second protrusion 214, each of which is configured to be disposed with a portion of notch 208. Via this disposition, current sensor 210 is configured to measure the current across bus bar 200. In an example, first protrusion 212 and second protrusion 214 function as a Hall effect sensor, such as a choroidal Hall effect sensor or an integrated differential Hall effect sensor. The proximal end of current sensor 210 may include additional processing or sensing capabilities that communicate with first protrusion 212 and second protrusion 214 (e.g., Allegro ACS37612 Hall effect sensor, 10 mV/G sensitivity with a magnetic input range of −135 to +135 Gauss and a voltage output range of 0.3 to 3V). It should be appreciated that other Hall effect sensors are likewise contemplated herein.

The purpose of this specific mechanical disposition between first protrusion 212, second protrusion 214, and notch 208 is to ensure that the Hall effect sensor is as close as possible to the bus bar 200. For example, in an embodiment, each of first protrusion 212 and second protrusion 214 has an air gap (e.g., 0.5 to 1 mm) between the respective protrusion and the bus bar 200.

Because the shape of the bus bar 200 affects magnetic flux, its specific positioning and geometric tolerance with respect to notch 208 is critical. In a preferred embodiment, bus bar 200 is 3.175 mm thick and 25.4 mm wide, having a width of 6 mm along notch 208 and having a notch 208 that is 3.175 mm in length. It should be appreciated that other geometric ranges are, likewise, contemplated herein so long as Hall effect sensor is within its functional range for detecting current at bus bar 200.

As an example, current sensor 210 is configured to accurately measure current across bus bar 200 between zero and 500 amps. Current sensor 210 detects current at bus bar 200, and subsequently transmits this current information to a communications port 216 at the distal end of current sensor 210. For example, communications port 216 includes a 12-bit A/D port. Communications port 216 is configured to provide measured information (e.g., current information and/or temperature) to a smart control pack of winch 100, as discussed in greater detail herein. Generally, current sensor 210 and/or a controller on winch 100 includes a 12-bit analog-to-digital converter. To accurately sense from −570.2 A to +570.2 A, the per-bit granularity is 0.28 A. In an alternate embodiment, a 16-bit analog-to-digital converter is used to overall improve precision. In an embodiment, current sensor 210 transmits measured current directly to the control pack, providing superior noise immunity.

In an embodiment, proximal end of current sensor 210 is mounted to the bus bar 200 via two screws 218 with non-conductive washers (e.g., polyetherimide washers) to ensure proper spacing of current sensor 210 above bus bar 200. Proximal end of sensor 210 may additionally include a circuit board for processing or converting detected signals at bus bar 200.

In an embodiment, proximal end of current sensor 210 further includes a temperature sensor. Temperature (e.g., temperature at or near bus bar 200) can be used, for example, to improve accuracy of calculated current values and to provide additional useful metrics (e.g., ambient temperature and/or winch overheating).

Figure 3:
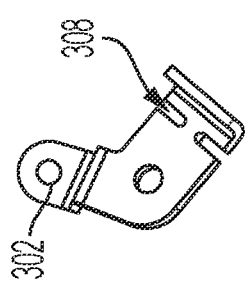
FIG. 3 illustrates a bus bar, according to an example embodiment of the present disclosure.
Figure 3:
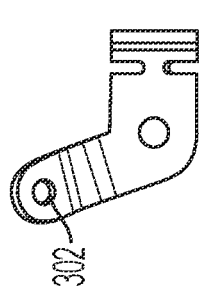
Figure 3:
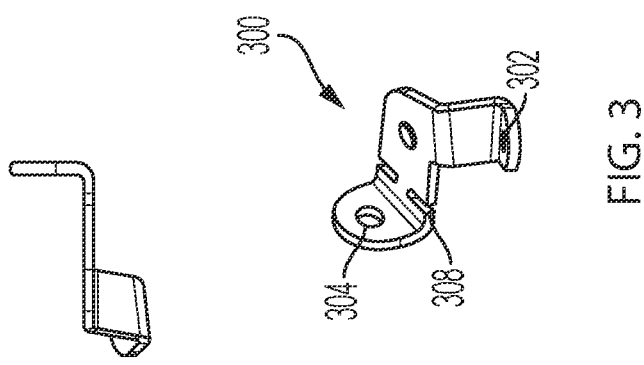
Figure 3:
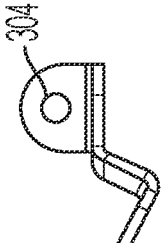

As noted above, bus bar 200 includes one or more bends (e.g., oblique and/or right angles) to accommodate its positioning within housing 160 of winch 100. In an alternative embodiment, however, bus bar has a flat configuration. Namely, FIG. 3 illustrates perspective and multiple side-views of a bus bar 300, constructed of copper. Bus bar 300 generally includes a plurality of apertures 302, 304, which are configured for mechanical and electrical engagement with terminals, such an electrical terminal and a motor terminal (not illustrated). Namely, as an example, the electrical terminal is disposed within and mechanically affixed to aperture 302; similarly, a motor terminal is disposed within an mechanically affixed to aperture 304. Thus, via this mechanical engagement, electrical power flows from the electrical terminal to bus bar 300, across the bus bar, and into the motor terminal (not illustrated). It should be appreciated that bus bar 300 may include additional apertures along its length.

In an example embodiment the width of bus bar 300 is fixed across the length of bus bar 300, but for a notch 308. Furthermore, it should be appreciated that the thickness of bus bar 300 is fixed across the length of bus bar 300. Notch 308 constitutes a reduced width across a portion of the length of bus bar 300. Notch 308 is configured to receive a proximal end of a current sensor (e.g., current sensor 210 including first protrusion 212 and second protrusion 214, as discussed above). Via this disposition, the current sensor is configured to measure the current across bus bar 300. In a different example embodiment, bus bar 300 may include a first width at a first end (e.g., the end with aperture 302) and a second width at a second end (e.g., the end with aperture 304). In various embodiments, bus bar may include one or more angular bends along its length.

It should be appreciated that other geometric ranges are, likewise, contemplated herein so long as Hall effect sensor is within its functional range for detecting current at bus bar 300.

As noted previously, dynamic detection of electrical parameters, such as current, is helpful to safely manage mechanical loads and avoid overloading of certain components, such as a remote clutch controlled by a smart control pack of winch 100.

Figure 4:
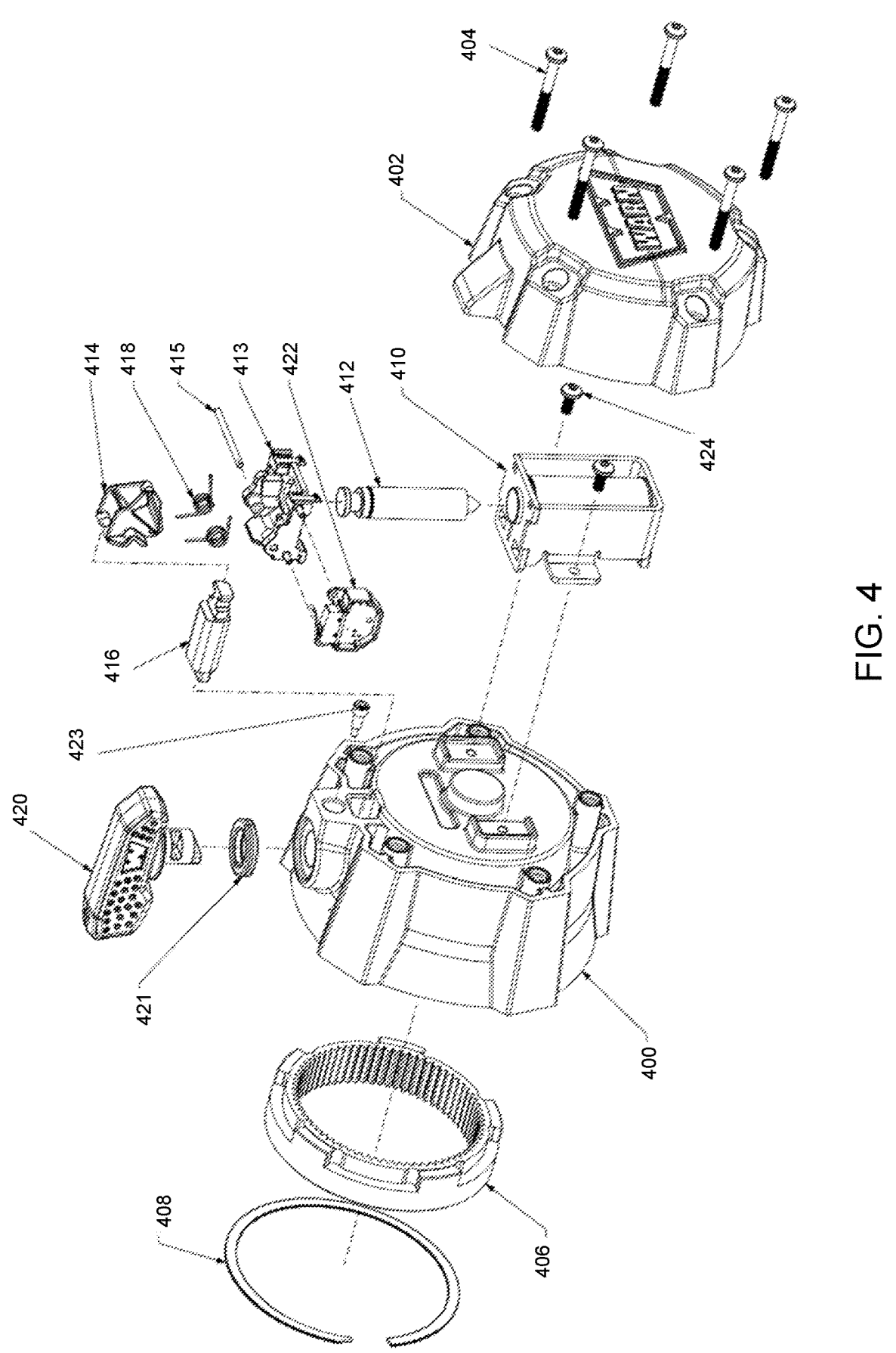
FIG. 4 illustrates a remote clutch with manual override, according to an example embodiment of the present disclosure.

FIG. 4 illustrates a remote clutch with manual override, which could be implemented with any winch disclosed herein, such as winch 100. Specifically, similar to gear housing 126 discussed previously, FIG. 4 illustrates gear housing 400.

Gear housing 400 is coupled to gear end cap 402 via a plurality of fasteners 404. Fasteners 404 may additionally be configured to couple gear housing 400 to a drum support (e.g., second drum support 112 depicted in FIG. 1 above). It should be appreciated that other mechanical means, besides fasteners, are likewise contemplated for coupling gear housing 400 to the drum support. The gear housing 400 typically includes a ring gear 406 (e.g., second stage ring gear) and related retaining ring 408.

Generally, free spool functionality is provided to the winch by disconnecting ring gear 406 from the drivetrain. Thus, in previous iterations, winches had the capability to enter into free spool either manually (e.g., via a clutch lever or dial) or remotely (e.g., via electronic or pneumatic means). The remote clutch with manual override disclosed herein combines these capabilities, providing for both manual and remote free spool.

Specifically, prior electronic free spool systems operated by exciting a solenoid that was connected to a pawl. The pawl pivots on a pin, such that downward action of the pawl creates an upward action on the opposite side of the pawl, disconnecting the pawl from the ring gear.

By comparison, the new remote clutch with manual override disclosed herein utilizes an electromagnetic solenoid assembly 410 having a plunger 412.

Regarding the electrical functionality of solenoid assembly 410, it should be appreciated that solenoid assembly 410 may include one or more separate coils, either with the same or different amp-turns on a coil-by-coil basis. Force generated by solenoid assembly 410 is exponentially related to airgap between a stationary pole and the plunger 412. For this reason, the amp-turns required to "hold" the solenoid 410 is far less than the amp-turns required during the initial "pull" phase. This allows for implementation of a low power mode. Specifically, the system starts with an initial high power mode to shift into a free spool state (as described in greater detail herein); however, once in a free spool state, the system can switch to low power mode and "hold" the solenoid 410 in free spool for a desired amount of time. Low power mode may consist of multiple coils, with one coil being lower power draw, or, alternatively, a more sophisticated pulse width modulation for power draw, or any other means of drawing less power during a holding phase. The solenoid 410 may be simply controlled to switch power to the system, or may integrate more advanced electronics and logic to gain more features and feedback.

Whereas prior remote clutches required a separate secondary winding to control the solenoid's hold force, separate from the pull force, the remote clutches herein provide for one single solenoid winding for solenoid assembly 410 that is capable of initiating both hold and pull forces; this reduces overall power requirements for the winch, making it more efficient. This single coil/winding is implemented by modulating the current during the "hold" time by modulating the current during the hold time via pulse-width modulation (PWM). For example, with PWM the system turns on for a period of time, then turns off. Namely, PWM current is approximately 10% of the "pull" current, thus reducing thermal loss in solenoid assembly 410 as well as in the smart control pack. The longer the system is on compared to the time that the system is off, the stronger the overall current. Given solenoid 410 is effectively an inductor, the current is filtered by the inductor; thus, the current to solenoid 410 does not change quickly. This means that the current only changes gradually, smoothing out any power ripples, even though the power is spiking every time the PWM turns on.

In an embodiment, the control circuitry within smart control pack is designed to ramp the PWM on and off over the span of several micro-seconds, thus reducing electromagnetic interference and reducing thermal rise caused by voltage spikes. Similarly, in an embodiment, the control circuitry within smart control pack is designed to jitter the PWM frequency, thus reducing electromagnetic interference, reducing sonic noise, and lessening the overall amplitude of noise energy.

Turning now to the mechanical functionality of solenoid 410, plunger 412 is disposed concentrically within pivot base 413. Pivot base 413 is affixed to solenoid 410, such that it is fixed relative to solenoid 410. By comparison, plunger 412 translates within each of solenoid 410 and pivot base 413. Pivot arm 414 is pivotably coupled to pivot base 413 via pivot pin 415. During solenoid 410 engagement, when the plunger 412 moves in a radial direction (i.e., toward the centerline of the drum/transmission), the plunger 412 provides torque into the pivot arm 414, which subsequently pivots about pivot pin 415. Torque at this pivot arm 414 is translated into axial motion of the clutch pin 416 (i.e., parallel to the centerline of the drum/transmission). This axial motion of clutch pin 416 unlocks ring gear 406, thus providing a free spool state for the winch. Electromagnetic solenoid assembly 410 can advantageously be activated via remote control, via a phone application, and/or via a smart control pack either disposed on the winch or located remotely from the winch.

In an embodiment, pivot arm 414 includes one or more torsion springs 418. For example, torsion springs 418 provide mechanical biasing and ensure that the default state for the remote clutch system is engaged (and not free spool). In alternate embodiments, other types of mechanical biasing devices are implemented to ensure that the default state for the remote clutch system is an engaged state.

In an embodiment, solenoid 410 is configured to have a maximum limit-force for engagement. Namely, the remote clutch is configured so that when the winch is experiencing line force above a certain threshold (i.e., during a winch pulling operation), the solenoid 410 cannot overcome friction forces between the clutch pin 416 and ring gear 406. Thus, via this threshold, the winch system prevents accidental disengagement of clutch ping 416 (causing a free spool state) during winch pulling.

Additionally, the remote clutch provides for manual override. Namely, a user can rotate a clutch handle 420 (disposed along a top side of gear housing 400). Clutch handle 420 may be disposed along gear housing 400 and include a clutch seal 421, configured to prevent water, dust, and other elements from entering the gear housing 400. Clutch handle 420 may be affixed within gear housing 400 via a detent screw 423, configured to engage with a slot on clutch handle 420 to allow clutch handle 420 to rotate while simultaneously preventing removal of clutch handle 420 from gear housing 400.

Clutch handle 420 has a protrusion or other keyed-feature to interact with a portion of clutch pin 416. For example, by rotating clutch handle 420, a protrusion on clutch handle 420 pushes clutch pin 416. Via this mechanical engagement (e.g., via the protrusion), clutch handle 420 can force clutch pin 416 to translate axially away from ring gear 406, thus providing a free spool state. When clutch handle 420 is rotated back to an engaged position, the torsion springs 418 force the clutch pin 416 back into engagement with the ring gear 406.

Advantageously, clutch handle 420 mechanically engages with and interacts with clutch pin 416, and not directly with ring gear 406. In this way, the spring-loaded clutch pin 416 avoids a "block shift" scenario, whereby the clutch handle 420 interferes with one of the lugs in the ring gear 406, preventing the user from reengaging the clutch.

This system allows the clutch handle 420 to rotate back to "engaged" position and, subsequently when the drum moves, the clutch pin 416 automatically reengages the transmission.

In an embodiment, gear housing 400 further includes a feedback switch 422. For example, when clutch pin 416 disengages ring gear 406, such that the winch is disposed in a free spool state (whether remotely or manually via clutch handle 420), feedback switch 422 is triggered. Feedback switch 422 thus provides other winch systems (e.g., remote controls and/or a smart control pack disposed on the winch) with a status of the free spool state. This provides the control systems with awareness of the free spool state, and allows the overall system to display status feedback in the form of winch lighting, remote LED indicators, notifications on a user's phone, and the like. This status feedback is discussed in greater detail herein.

Solenoid 410, pivot arm 414, and clutch pin 416 are expected to be provided with a winch but, alternatively, could also be purchased by customers and installed as an add-on accessory to an existing winch. For example, solenoid 410 is mountable to an end of gear housing 400 via a plurality of fasteners 424, such that it is contained within an endcap that can readily replace a standard endcap. Control of solenoid 410 is facilitated via the smart control pack of the winch.

Smart control pack may include a number of additional features that are complimentary with solenoid 410 and its related control. In an example embodiment, the smart control pack includes overload protection circuitry that can be disengaged, thus reducing quiescent leakage current when the winch is off. For example, an output from the smart control pack is used to turn on the overload protection circuitry as well as the related tri-state logic switch; turning this output off reduces quiescent current, thus protecting the vehicle battery from slowly being drained over time.

In another example embodiment, the smart control pack includes over-current protection. One form of over-current protection is a hardware based fast short detect. Namely, by sensing a voltage drop across a resistor (e.g., 4 mΩ resister) in series with the high current path through the remote clutch and solenoid 410, fast short detect transistor will turn on, thus immediately turning off individual MOSFETs and protecting from over-current.

Another form of over-current protection involves detecting a voltage drop across a field-effect transistor. Namely, by sensing that voltage across the field-effect transistor is greater than the voltage drop from the source side of the field-effect transistor, smart control pack may trigger an alarm indicating that the current through the clutch is undesirably high. For example, depending on part value variance and temperature, the over-current protection could trigger as low as 30.8 amps or as high as 47 amps. This is considerably lower than the fast short detect, which triggers around 60 amps. The reasoning being that the fast short detect immediately shuts off the field-effect transistor during a voltage spike, giving the firmware short detect time to react with more precision.

In another example embodiment, the smart control pack includes a tri-state logic switch, configured as a single switch to provide clutch feedback including "clutch active," "clutch inactive," and "clutch not present." For example, a clutch position sensor operates in tandem with a simple switch on the remote clutch itself. Signal from the clutch position sensor goes to an analog input of the microcontroller at the smart control pack. Three different voltage ranges determine clutch feedback.

As the embodiments thus far have repeatedly mentioned the smart control pack, this pack warrants its description particularly with respect to individual features of the smart control pack. With reference to FIGS. 5A to 5C, smart control pack 500 is illustrated in various configurations.

FIG. 5A illustrates smart control pack 500, also referred to more generally as control pack 500, disposed on top of winch 100 (previously described above with reference to FIG. 1). For example, control pack 500 may be affixed to one or more of first drum support 110, second drum support 112, and tie structure 120. As illustrated, control pack 500 is removably affixed to the tie structure 120. Namely, the tie structure 120 is the only component coupled to both the first drum support 110 and the second drum support 112 that is disposed between the first drum support 110 and the second drum support 112.

FIG. 5B illustrates smart control pack 500 and related electrical connections. Specifically, smart control pack 500 generally includes an external housing 502, configured to protect electrical components disposed within control pack 500. Additionally, smart control pack 500 includes a base having a plurality of apertures 504. Each of the plurality of apertures 504 are configured to receive a respective fastener (e.g., for affixing smart control pack 500 to tie structure 120). In an embodiment, smart control pack 500 is replaceable. Namely, an existing control pack on winch 100 can be removed and substituted for control pack 500; as an alternative, control pack 500 can be swapped among several different winches.

Control pack 500 includes an external power supply cable 506. In an embodiment, a first end of external power supply cable 506 is coupled to an external power supply whereas a second end of external power supply cable 506 is coupled to control pack 500. External power supply cable 506 provides electrical power to control pack 500 and winch 100. In a particular example embodiment, the second end of external power supply cable 506 is coupled directly to winch 100 at a bus bar (as described in greater detail herein with respect to FIG. 5C).

In an embodiment, smart control pack 500 is fully powered from a 12 volt high current source, such as an automotive battery coupled at first end of external power supply cable 506. In an alternative embodiment, control pack 500 is powered via a 12 volt CAN bus, which may provide electrical power sufficient for control pack 500 functionality, but insufficient for powering winch operations. Generally, smart control pack 500 has circuitry to protect it from over-current and reverse polarity, regardless of which source is providing power. Additionally, control pack 500 may include protection circuitry for over-voltage (e.g., ISO 7637-2 and/or ISO 16750 load dump protection), as well as over current and over voltage protection on the CAN supply.

In an embodiment, by using a separate ground for the comparator, voltage select circuitry is protected during high-voltage spike events (e.g., during load dump). This voltage select circuitry determines which voltage source is higher (e.g., automotive battery or CAN bus), and selects that one to be active. Selection information is also delivered to the microcontroller, so that control pack 500 can determine whether to enable the reverse voltage protection field-effect transistor for high power winch functions. In an embodiment, a reverse voltage protection field-effect transistor protects the circuit from the battery being plugged in backwards. Namely, though it permits current to flow through the body diode, the resistance is too high for high power uses; thus, the battery enable signal from the micro-controller turns on the field-effect transistor for high power activity.

In an embodiment, control pack 500 includes a lighting cable and/or lighting wiring coupled to one or more lights disposed along winch 100. Lighting cable and/or lighting wiring may be configured to couple to a circuit board within control pack 500 and receive information from control pack 500 (e.g., lighting control information). For example, responsive to certain winch operations (e.g., winch on/off, winch power in below a threshold, winch power in near a threshold, winch power in exceeding a threshold, winch temperature below a threshold, winch temperature near a threshold, winch temperature exceeding a threshold, winch voltage below a threshold, winch voltage near a threshold, winch voltage exceeding a threshold, or any other winch status such as clutch engagement, free spool, manual override, or the like) the winch may display one or more different lighting protocols including color, color change, flashing, dimming, or other similar optical phenomena. Similarly, for example, responsive to certain user-provided commands or customization requests (via the cell phone application), the user may control and customize the overall lighting of the winch (e.g., winch lights, lights of a vehicle coupled to the winch, and the like).

In an embodiment, control pack 500 further includes a current sensor cable. In an embodiment a first end of current sensor cable is coupled to a bus bar (as described in greater detail below with respect to FIG. 5C). In a related embodiment, a second end of current sensor cable includes a communication port configured to couple to the circuit board within control pack 500 and send information to control pack 500 (e.g., sensed current information).

In an embodiment, control pack 500 may include a plurality of terminal receptacles 508. For example, electrical terminals of winch 100 (e.g., conductive protrusions extending through the housing of winch 100) may be disposed within apertures of each of the plurality of terminal receptacles 508. Namely, via terminal receptacles 508, electrical power is transmitted from external power supply cable 506, through control pack 500, and to a winch motor via motor terminals disposed within terminal receptacles 508. Control pack 500 may additionally include an electrical grounding cable (e.g., for added electrical protection).

FIG. 5C illustrates smart control pack 500, with housing 502 removed (so as to better view internal components of control pack 500. Specifically, as noted previously, the first end of current sensor cable 512 is coupled to a bus bar 514. It should be appreciated that bus bar 514 depicted in FIG. 5C is similar to bus bar 200 depicted in FIGS. 2A to 2B. Namely, bus bar 514 includes a notch, which constitutes a reduced width across a portion of the length of bus bar 514. The notch is configured to receive the first end of current sensor cable 512. For example, current sensor cable 512 includes two protrusions, each of which is configured to be disposed within a portion of the notch of bus bar 514.

Current sensor cable 512 detects current at bus bar 514, and subsequently transmits this current information to a communications port at the second end of current sensor cable 512. For example, the communications port includes a 12-bit A/D port. Communications port is configured couple to a circuit board within control pack 500 to provide measured information (e.g., current information and/or temperature) to smart control pack 500.

Most of the electrical connections to control pack 500 (e.g., a lighting cable and/or a current sensor cable) along with related electrical circuitry and circuit boards are self-contained within control pack 500. The sole external connection from control pack 500 is that of external power supply cable 506. For this reason, in an embodiment, control pack 500 can be relocated (i.e., removed from winch 100) and still function as a control means for winches; for example, in certain embodiments control pack 500 is located physically remote from the winch 100.

Generally, it should be appreciated that smart control pack 500 may include a number of additional sensors that provide information regarding the external environment. These sensors could include, for example, a 9-axis inertial measurement system and an atmospheric pressure sensor. Each of these sensors are connected to control pack 500 via a serial bus implementing serial peripheral interface or other related architectures. In an embodiment, power to each of these sensors is supplied from an output of the microcontroller of smart control pack 500 (e.g., for low power sensors). In an alternative embodiment, power is received from a load switch, permitting sensors that have higher power demands.

Advantageously, smart control pack 500 includes its own non-volatile memory (e.g., a serial peripheral interface flash memory chip). By having discrete memory on smart control pack 500, winch 100 has the capability to permanently store certain information related to the winch and its performance.

Specifically, the flash memory within smart control pack 500 affords winch 100 with the ability to store "non-logging" data. Examples of non-logging data can include information that is unique to winch 100 or a class of winches, such as error message text, coefficients for assorted calculations (e.g., load and voltage), serial number, firmware revision numbers, hardware revision numbers, and the like.

The flash memory within smart control pack 500 additionally affords winch 100 with the ability to store "logging"

data associated with specific performance conditions of winch 100. Examples of logging data can include voltage, temperature, current, error states, winch events, winch usage (e.g., in/out/freespool), time active, time asleep, power on, power off, time connected to the cell phone application, load (indirectly), acceleration, magnetometer information, gyro information, pressure information. Smart control pack 500 can additionally log information derived from the cell phone application itself, such as geographic location of the cell phone (and thus the winch 100), application usage, notes, and the like. All of this information is timestamped when stored within smart control pack 500.

Information stored within smart control pack 500 may relate to any number of performance characteristics. For example, "On-Time" characterization reflects the time since winch 100 was connected to a battery. "Events" characterization can include things such as low-battery events, over-temperature events, and the like. "Warranty/Service" characterization can include a ledger for service/installation centers to track and log when a winch was serviced or installed. "Failure Analysis" characterization can include information about winch failures and, more particularly, the external conditions at the time of winch failure. "Usage Histogram" characterization can include graphical histogram information depicting a particular winch session, including winch in/out, load, orientation, slippage, and GPS location (provided by the phone), among others. "Location" characterization can include the physical location of winch 100, including its GPS coordinates and/or depiction on a visual map. "Winch Usage" characterization can include information related to frequency of winch use, time spent winching in/out, time spent rigging vs. operating the winch, and the like. "User Logs" characterization can include user-provided information such as notes associated with a particular geographic location or winching session. "Anonymized Data" characterization can include collection, anonymization, and aggregation of winch-specific data in an effort to see larger patterns (e.g., ten-year-old winch performance, or winch-usage in Montana). Data stored at smart control pack 500 can further be used to identify frequent-users and/or VIP customers. It is worth emphasizing that all of this information is accessible via the cell phone application and related cellular device in wireless communication with smart control pack 500.

Smart control pack 500 may additionally include an expansion port to allow for additional external sensor features. For example, expansion port may provide power and communications to a variety of potential battery powered sensor features (e.g., Smart Hook). In an embodiment, expansion port is connected to the additional sensor features via a docking station built into the winch or bumper, via a wire harness, via a plug-in port on the winch, or via other similar means. In an embodiment, expansion port includes one or two power rails (e.g., 5 volt, 3.3 volt, or both 5 volt and 3.3 volt). Expansion port further includes a serial interface and a ground pin.

In an embodiment, smart control pack 500 implements a separate power board that contains and controls the high-power rails for the winch system. The separate power board includes thick copper traces, and implements multiple layers of circuitry to transfer the high current. This allows the separate board to function as a bus bar, even though the separate board is actually a printed circuit board. Because the separate board is a printed circuit board, it can be easily connected to various sensor circuitry. The separate board is configured to plug into the control board through a connector, which passes control and sense signals back to the microcontroller and related control circuitry of control pack 500.

Control pack 500 may additionally provide for voltage sense capabilities via a 12 volt detection circuit and a 5 volt detection circuit, including zero leakage, protection circuitry, cable characterization, and high-accuracy input. Regarding zero leakage, the detection circuit is configured to not draw any current unless it is enabled (e.g., when the microcontroller is active). With both the 5 volt and 12 volt detectors, the voltage measured is greater than the voltage limits of the microcontroller; thus, the measured voltage must be lowered via a voltage divider. In an embodiment, a pair of transistors enable voltage division.

Regarding protection circuitry, the voltage sensor is protected against over-voltage, over-current, and reverse polarity. For example, a Zener diode prevents voltage at the battery sense signal from exceeding 33 volts, thus protecting the transistors. Similarly, the microcontroller input is protected by the Zener diode. In an embodiment a resettable fuse is triggered if current through the voltage sense circuitry exceeds 30 mA. In an embodiment, if the supply is plugged in backwards, protection diodes prevent damage to the system whether the battery is connected incorrectly, or whether the sense cables are connected incorrectly.

Regarding cable characterization, with most applications voltage at the battery is calculated based on characteristics of standard winch cables. For example, voltage sensed by the 12 volt sensor is the voltage at the smart control pack 500. To sense voltage at the battery, the voltage drop through the battery cables must be considered at high currents. The winches herein are provided with battery cables that are fully characterized over current and temperature; thus, using these characterized cables and the information provided by the temperature and current sensors, the voltage drop can be calculated within acceptable error bars.

Regarding high-accuracy input, for some applications, a precise voltage measurement is obtained by connecting a set of leads directly to the battery. Namely, when higher accuracy is desired on the 12 volt battery detector than can be provided by calculating voltage drop over the characterized cables, the smart control pack 500 provides a battery sense connector. Wires can be connected from this connector to the battery terminals of the vehicle, thus providing an accurate voltage measurement.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A current sensing system for a winch, the current sensing system comprising a current sensor disposed on a winch, wherein the winch is configured to receive power from an external source via a bus bar, such that the current sensor measures current passing through the bus bar, wherein the current sensor is a Hall-effect sensor, wherein the current sensor is mounted on the bus bar, wherein the bus bar includes a notch, configured to direct current past the current sensor, wherein the current sensor comprises a first protrusion and a second protrusion, wherein each of the first protrusion and the second protrusion are configured to be disposed within a portion of the notch of the bus bar and measure all the current passing through the bus bar, and wherein the bus bar is disposed such that all electrical power from the external power source to the winch flows across the bus bar.

2. The sensing system of claim 1, wherein the current sensor is a coreless Hall-effect current sensor.

3. The sensing system of claim 1, wherein the bus bar is coupled to a power cable.

4. The sensing system of claim 1, wherein the current sensor is mounted adjacent to a power cable.

5. The sensing system of claim 1, wherein the current sensor is electrically coupled to a data collection device.

6. The sensing system of claim 5, wherein the data collection device is a microcontroller.

7. The sensing system of claim 6, wherein the microcontroller includes an analog-to-digital converter.

8. The sensing system of claim 7, wherein the microcontroller transmits digital information associated with detected current, and wherein the digital information is transmitted over a digital transmission bus protocol.

9. The sensing system of claim 1, further comprising a temperature sensor.

10. The sensing system of claim 1, wherein the current sensor is powered via a control pack.

11. The sensing system of claim 10, wherein the control pack is disposed on the winch.

12. The sensing system of claim 10, wherein the control pack is disposed at a location remote from the winch.

13. The sensing system of claim 1, wherein the current sensor is powered directly via a power cable.

14. A current sensing system for a winch, the current sensing system comprising a current sensor disposed on a notched bus bar of a winch, such that the current sensor measures current passing from an external power source to the winch, wherein the current sensor comprises a first protrusion and a second protrusion, wherein each of the first protrusion and the second protrusion are configured to be disposed within a portion of the notch of the bus bar and measure all the current passing through the bus bar, and wherein the bus bar is disposed such that all electrical power from the external power source to the winch flows across the bus bar.

15. The sensing system of claim 14, wherein the current sensor is a Hall-effect sensor.

16. The sensing system of claim 15, wherein the current sensor is a coreless Hall-effect current sensor.

17. The sensing system of claim 14, wherein the current sensor is powered via a control pack disposed on the winch.

\* \* \* \* \*